United States Patent
Gerber et al.

(10) Patent No.: US 6,858,932 B2
(45) Date of Patent: Feb. 22, 2005

(54) PACKAGED SEMICONDUCTOR DEVICE AND METHOD OF FORMATION

(75) Inventors: Mark A. Gerber, Austin, TX (US); Shawn M. O'Connor, Austin, TX (US); Trent A. Thompson, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/072,167

(22) Filed: Feb. 7, 2002

(65) Prior Publication Data

US 2003/0148554 A1 Aug. 7, 2003

(51) Int. Cl.⁷ .............................................. H01L 23/34
(52) U.S. Cl. ........................ 257/712; 257/713; 438/122
(58) Field of Search ................................. 257/701, 704, 257/702, 712, 713, 718, 720, 719; 438/122, 124, 126, 127

(56) References Cited

U.S. PATENT DOCUMENTS

| | | |
|---|---|---|
| 5,376,588 A | 12/1994 | Pendse |
| 5,761,044 A | 6/1998 | Nakajima |
| 5,843,808 A | 12/1998 | Karnezos |
| 5,844,168 A | 12/1998 | Schueller et al. |
| 5,970,319 A | 10/1999 | Banks et al. |
| 5,973,403 A | 10/1999 | Wark |
| 6,008,536 A * | 12/1999 | Mertol ........................ 257/704 |
| 6,023,098 A | 2/2000 | Higashiguchi et al. |
| 6,157,080 A | 12/2000 | Tamaki et al. |
| 6,181,002 B1 | 1/2001 | Juso et al. |
| 6,184,580 B1 * | 2/2001 | Lin ............................. 257/712 |
| 6,414,385 B1 * | 7/2002 | Huang et al. ................ 257/690 |

* cited by examiner

*Primary Examiner*—Roy Potter
(74) *Attorney, Agent, or Firm*—Daniel D. Hill; Joanna G. Chiu

(57) ABSTRACT

A packaged semiconductor device (20) has a first integrated circuit die (28) having a top surface with active electrical circuitry implemented thereon. The first die (28) is mounted in a cavity (21) of a first heat spreader (22). A second die (36) having electrical circuitry implemented on a top surface is attached to the top surface of the first die (28). Both of the die (28 and 36) are electrically connected to a substrate (24) mounted on the first heat spreader (22). A second heat spreader (40) is mounted on the top surface of the second die (36). The second heat spreader (40) provides an additional path for thermal dissipation of heat generated by the second die (36).

21 Claims, 3 Drawing Sheets

PACKAGED SEMICONDUCTOR DEVICE AND METHOD OF FORMATION

FIELD OF THE INVENTION

The invention relates generally to a packaged semiconductor device and more particularly to a method of forming a packaged semiconductor device.

BACKGROUND

In packaging integrated circuits, it is desirable to provide a package that allows for multiple semiconductor die within the package. There are several advantages to including multiple die within one package. For example, packaging costs can be reduced and the amount of space required on a printed circuit board can be reduced. One way to accommodate multiple die within a package is to stack one die on top of another die. However, one problem with the stacked die solution is that thermal dissipation of the die on top of the stack is through the bottom die. For packaged high power devices, the amount of heat that can be dissipated through the bottom die is limited. Therefore, a need exists for a packaged semiconductor device for stacked die having improved thermal dissipation.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention.

DETAILED DESCRIPTION

Generally, the present invention provides a packaged semiconductor device for stacked die that improves thermal dissipation by attaching a heat spreader to the top die. The heat spreader attached to the top die supplements a heat spreader that is used to support the bottom die. The bottom heat spreader has a cavity for supporting the stacked die to reduce the height of the device. When the packaged device is attached to a printed circuit board (PCB), the heat spreader attached to the top die contacts the PCB and provides a direct thermal path for sinking heat generated by the operation of the top die. The invention is better understood by turning to the figures.

Figure 1:
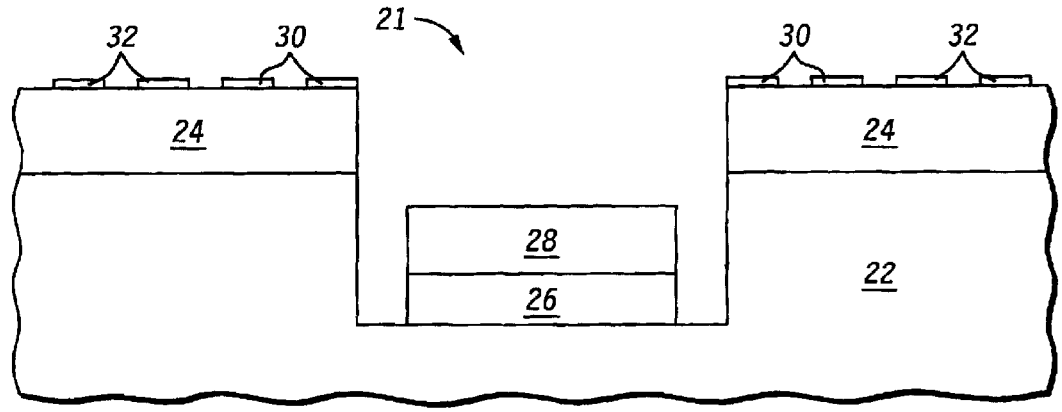
FIGS. 1–7 include illustrations of sequential cross-sectional views of a package device formed in accordance with an embodiment of the present invention.

FIG. 1 illustrates a device 20 in accordance with an embodiment of the present invention. Packaged device 20 includes a heat spreader 22 having a cavity 21. In the illustrated embodiment, heat spreader 22 is formed from copper. If formed from copper, heat spreader 22 may be plated with another metal such as chromium silver, nickel-gold, or the like. In other embodiments, heat spreader 22 may be formed from any other thermally conductive material. A package substrate 24 is attached to heat spreader 22. Package substrate 24 also has an opening corresponding generally to the opening of cavity 21. The top of substrate 24 includes one or more wire bond fingers 30 and one or more solder ball pads 32. In one embodiment of the present invention, pads 32 are formed from a conductive material and may be used for mechanical and electrical connection of device 20 to a PCB. Also, pads 32 may be used to mount discrete devices, may be used to receive test probes for testing purposes, or may be used to receive conductive interconnects (e.g. solder balls). In the illustrated embodiment, wire bond pads 30 are used to electrically connect the die to the package substrate. However, in other embodiments, other techniques may be used for electrically connecting the die to the substrate. Also, substrate 24 contains electrical conductors such as traces (not shown) that connect the wire bond pads 30 to the solder ball pads 32. A semiconductor die 28 having electrical circuitry is aligned in cavity 21 and attached to heat spreader 22 using a die attach material 26. Alternately, die 28 may be attached to heat spreader 22 using a die attach tape.

Figure 2:
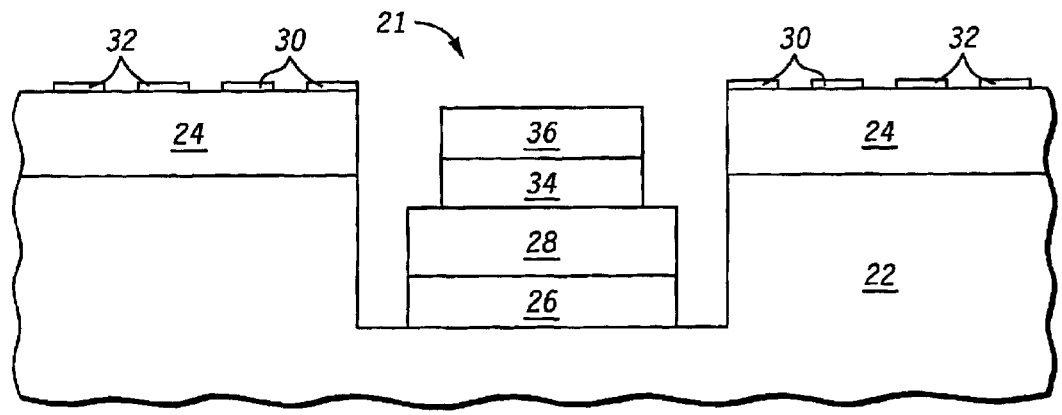

FIG. 2 illustrates one embodiment of packaged device 20 in which a second die 36 is aligned and attached to the top surface of die 28 using a die attach material 34. Generally, die 36 will have a smaller surface area than the surface area of die 28 to which it is attached.

Figure 3:
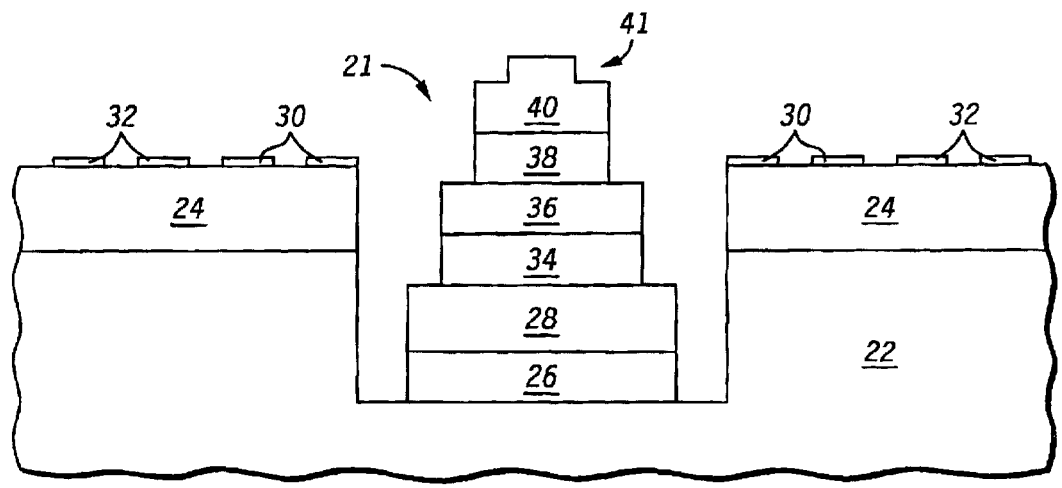

FIG. 3 illustrates one embodiment of package device 20 in which a second heat spreader 40 is attached to the top surface of die 36. Heat spreader 40 is attached to the top surface of die 36 using a die attach material 38. Die attach material 38 may be, for example, one of either epoxy or tape die attach material. In another embodiment, heat spreader 40 may be attached to die 36 by soldering heat spreader 40 to an appropriate sized metal pad (not shown) on die 36. Heat spreader 40 may be soldered to the metal pad before or after a wafer is singulated into individual die.

In one embodiment, heat spreader 40 is cast from copper. If formed from copper, heat spreader 40 may be plated with another metal such as chromium-silver, nickel-gold, or the like. In other embodiments, heat spreader 40 may be formed using another heat conducting material, such as for example, aluminum or gold, and may be shaped by either stamping, casting, etching, or machining. Also, in the illustrated embodiment, heat spreader 40 is formed to have a tapered, or stepped, feature or ledge indicated by reference number 41, such that the surface area of the bottom surface of heat spreader 40 is greater than the surface area of the top surface of heat spreader 40. Also, heat spreader 40 may be either cylindrical or rectangular in shape when viewed from a top down perspective. If a cylindrical shape is used for heat spreader 40, heat spreader 40 can be visualized as two cylinders connected to each other by their flat surfaces, where one of the cylinders has a smaller diameter than the other cylinder. If a rectangular shape is used for heat spreader 40, it can be visualized as two connected, or contiguous, boxes, where one box has a different volume than the other box. In other embodiments, heat spreader 40 may have a different shape, and may be formed from multiple pieces.

Figure 4:
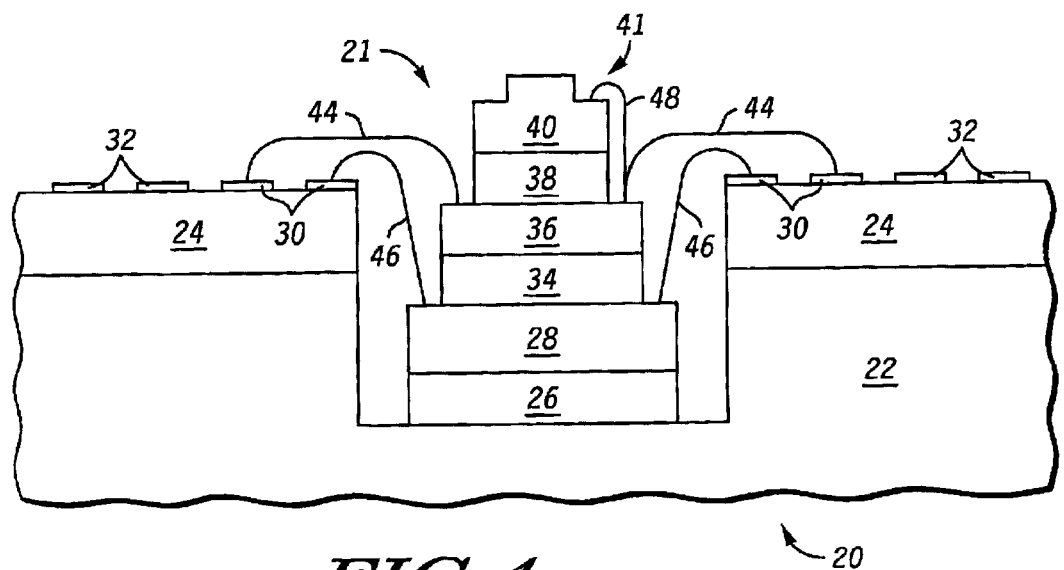

FIG. 4 illustrates one embodiment of device 20 in which dies 28 and 36 are electrically connected to bond fingers 30 by way of wire bonds 44 and 46. Alternate embodiments of the present invention may use any number of wire bonds 44 and 46 and bond fingers 30. Also, illustrated in FIG. 4 as an option, a wire bond 48 electrically couples heat spreader 40 to a location on die 36. For example, wire bond 48 may be used to electrically ground heat spreader 40 to die 36. The feature 41 in heat spreader 40 serves as a convenient place to attach the optional wire bond.

Figure 5:
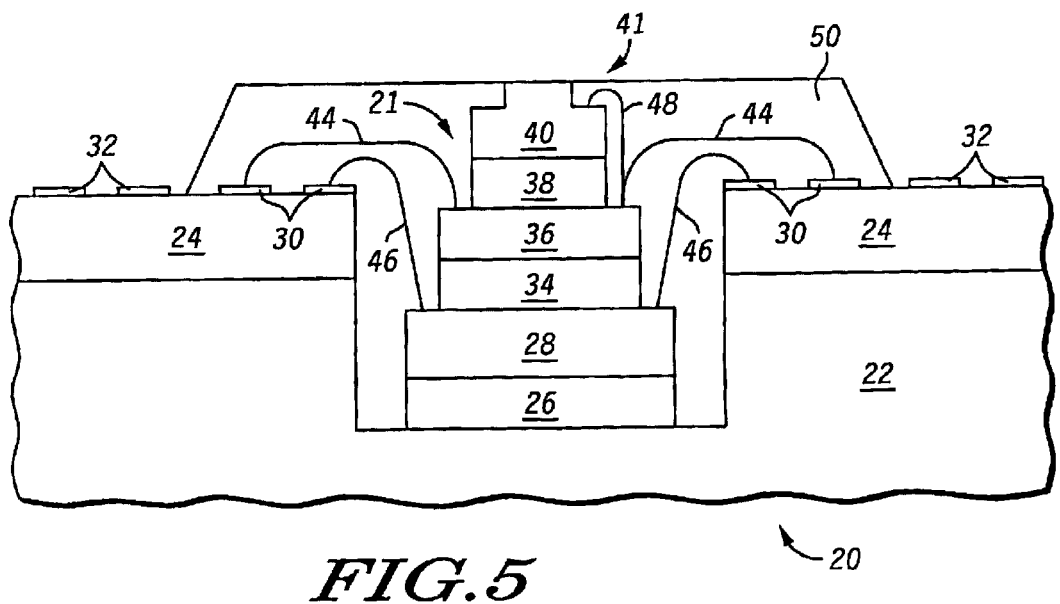

FIG. 5 illustrates one embodiment of device 20 in which an encapsulating material 50 has been deposited over the stacked die 36 and 28, heat spreader 40, and wire bonds 44, 46, and 48. Note that encapsulating material 50 may be any type of appropriate material for integrated circuits, such as, for example, a molded plastic or a liquid deposited glob material. Also, note that the top surface of encapsulating material 50 is level with the top surface of heat spreader 40 and does not cover the top surface of heat spreader 40. Also, feature 41 functions to lock heat spreader 40 to the top of die 36 and prevents heat spreader 40 from being pushed out of encapsulating material 50 after repeated thermal cycling of device 20. In addition, in the illustrated embodiment, encapsulating material 50 substantially fills all of cavity 21.

Figure 6:
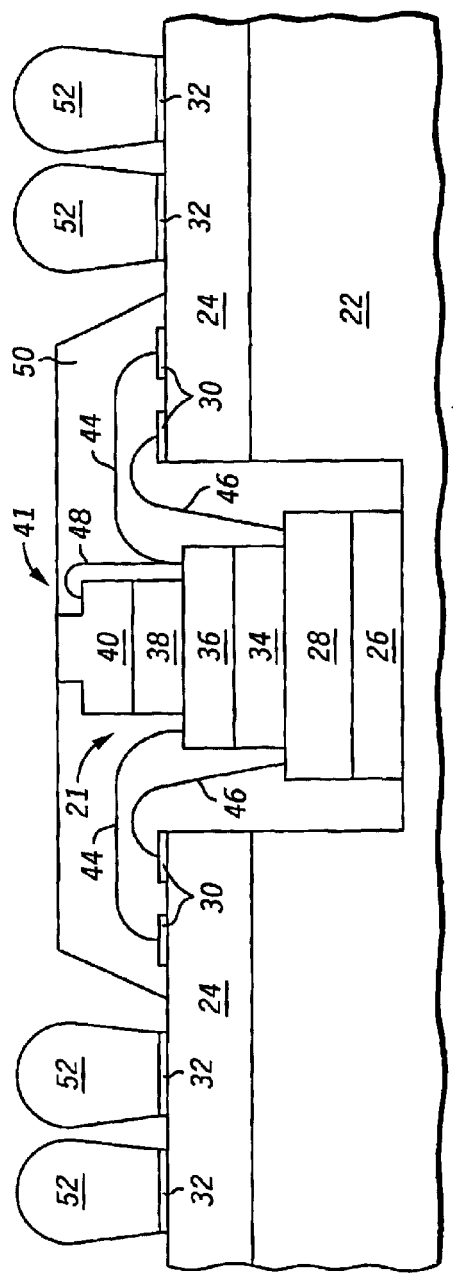

FIG. 6 illustrates one embodiment of device 20 in which a plurality of solder balls 52 are formed on the plurality of solder pads 32. Solder balls 52 are formed using one of the conventional techniques for depositing solder balls 52.

Figure 7:
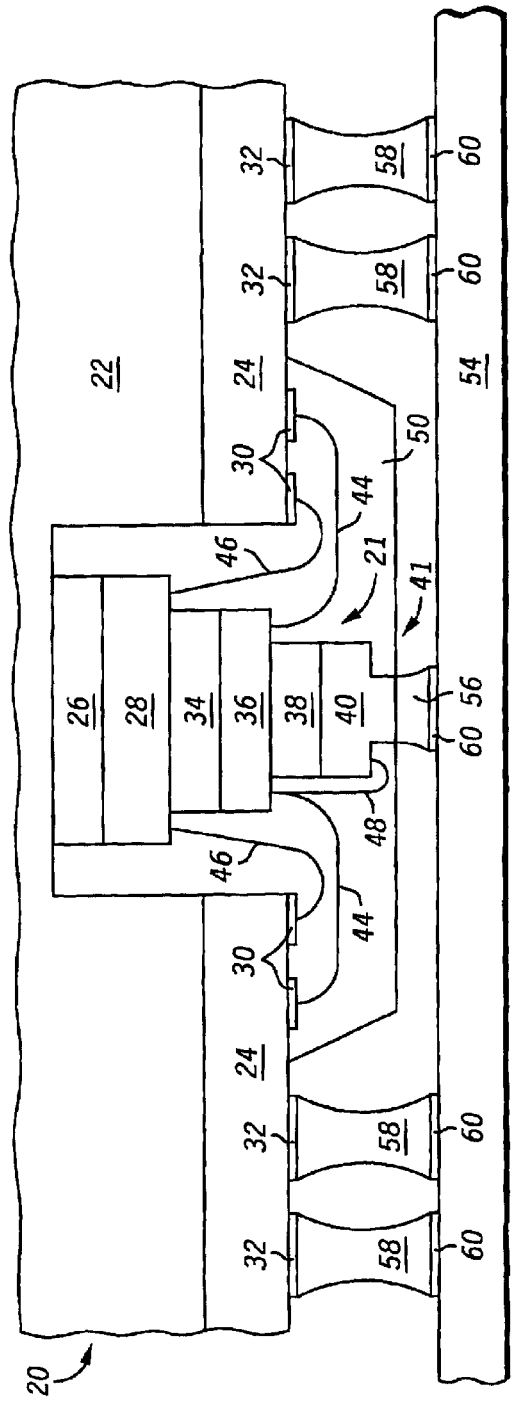

FIG. 7 illustrates one embodiment of device 20 in which device 20 is connected to a PCB 54. Note that in the illustrated embodiment, device 20 is flipped, or rotated, in order to attach device 20 to PCB 54. However, in alternate embodiments, device 20 may be oriented in any manner during its formation. PCB 54 includes a plurality of bond pads 60 that correspond in location to the solder pads 32. Solder balls 52 are heated and reflowed to provide an electrical connection to pads 60 that may also have screen printed solder paste, or the like, applied thereto. Also, a solder connection 56 is formed between heat spreader 40 and a corresponding pad 60 on PCB 54.

Heat spreader 40 provides a second heat dissipation path for device 20. During operation of device 20, heat is dissipated from die 36, at least in part, through heat spreader 40. The need for die 28 to dissipate heat generated by die 36 is reduced, thus allowing for stacked die semiconductor devices with greater power dissipation.

Note that traces and vias (not shown) within substrate 24 are used to selectively interconnect various portions of substrate 24. Note also that die attach materials 26, 34, and 38 may be any type of appropriate material, such as, for example, adhesive tape or non-solid adhesive (e.g. glue, epoxy). Die 28 and 36 may be any type of integrated circuit, semiconductor device, or other type of electrically active substrate. Alternate embodiments of the present invention may have any number of die 28 and 36 packaged within packaged semiconductor device 20. For example, alternate embodiments may package three die in package device 20. Note that the size and aspect ratios of die 28 and 36 may vary. Note that die 28 and 36 are located within cavity 21 of heat spreader 22 in the illustrated embodiment. However, in other embodiments, die 28 and die 36 may be located on a heat spreader that does not have a cavity 21. Also, heat spreader 22 may be patterned on the side opposite to cavity 21 to increase surface area for improved thermal dissipation.

In the foregoing specification the invention has been described with reference to specific embodiments. However, one of ordinary skill in the art appreciates that various modifications and changes can be made without departing from the scope of the present invention as set forth in the claims below. For example, any appropriate die attach processes, wire bond processes, solder ball forming processes, and tape processes may be used in the formation of package device 20, of which there are many known in the art. Accordingly, the specification and figures are to be regarded in an illustrative rather than restrictive sense, and all such modifications are intended to be included within the scope of the present invention. Benefits, other advantages, and solutions to problems have been described with regard to specific embodiments. However, the benefits, advantages, solutions to problems, and any element(s) that may cause any benefit, advantage, or solution to occur or become more pronounced are not to be construed as a critical, required, or essential feature or element of any of the claims.

What is claimed is:

1. A method for forming a semiconductor device, comprising:
   providing a package device having a first heat spreader, a package substrate overlying the first heat spreader, and a cavity extending through the package substrate and into the first heat spreader;
   attaching a first die to the first heat spreader within the cavity;
   attaching a second heat spreader to the first die;
   forming a plurality of wire bond connections between the first die and the package substrate; and
   encapsulating the electrical connections, the first die, and at least a portion of the second heat spreader.

2. The method of claim 1, further comprising:
   after attaching the first die to the first heat spreader, attaching a second die to the first die, wherein the second heat spreader is attached to the second die.

3. The method of claim 2, further comprising:
   forming a plurality of electrical connections between the second die and the package substrate,
   and wherein encapsulating further comprises encapsulating the second die.

4. The method of claim 3, further comprising forming at least one electrical connection between the second heat spreader and at least one of the first or the second die.

5. The method of claim 1, further comprising forming at least one electrical connection between the second heat spreader and the first die.

6. A semiconductor device, comprising:
   a first heat spreader;
   a cavity extending into the first heat spreader;
   a first semiconductor die within the cavity and attached to the first heat spreader; and
   a second heat spreader overlying the first semiconductor die, a die attach material being used to connect the first semiconductor die to the second heat spreader.

7. The semiconductor device of claim 6, further comprising a package substrate overlying the first heat spreader, wherein the cavity extends through the package substrate.

8. The semiconductor device of claim 7, further comprising a plurality or solder balls overlying the package substrate.

9. The semiconductor device of claim 7, further comprising a plurality of electrical connections between the first semiconductor die and the package substrate.

10. The semiconductor device of claim 9, further comprising an encapsulation layer encapsulating the plurality of electrical connections, the first semiconductor die, and at least a portion of the second heat spreader.

11. The semiconductor device of claim 6, further comprising:
    a second semiconductor die within the cavity, overlying the first semiconductor die and underlying the second heat spreader.

12. The semiconductor device of claim 11, wherein the second heat spreader is connected to the second semiconductor die via a first die attach and the second semiconductor die is connected to the first semiconductor via a second die attach.

13. The semiconductor device of claim 6, wherein the second heat spreader is soldered to a metal layer overlying the first semiconductor die.

14. The semiconductor device of claim 6, wherein the second heat spreader comprises a first portion and a second portion, the first portion closer to the first semiconductor die than the second portion, and wherein the first portion has a first surface area and the second portion has a second surface area that is less than the first surface area.

15. The semiconductor device of claim 14, wherein the first portion and the second portion are contiguous portions of the second heat spreader.

16. The semiconductor device of claim 14, further comprising:

an electrical connection coupled to the first portion of the second heat spreader and the first semiconductor die.

17. A semiconductor device, comprising:

a semiconductor die having a first surface and a second surface, the semiconductor die comprising active circuitry within the first surface; and a heat spreader connected to the first surface of the semiconductor die, wherein the heat spreader is soldered to a metal layer overlying a portion of the first surface of the semiconductor die.

18. The semiconductor device of claim 17, further comprising:

a second heat spreader underlying the second surface of the semiconductor die.

19. The semiconductor device of claim 18, wherein the first heat spreader provides a first heat dissipation path from the first semiconductor device, and the second heat spreader provides a second heat dissipation path from the first semiconductor device.

20. The semiconductor device of claim 18, further comprising a second semiconductor device underlying the second surface of the semiconductor device and overlying the second heat spreader.

21. The semiconductor device of claim 20, wherein the second surface of the semiconductor device is attached to the second semiconductor device via a first device attach layer, and the second semiconductor device is attached to the second heat spreader via a second device attach layer.

\* \* \* \* \*